(12) United States Patent
Zhou et al.

(10) Patent No.: US 10,498,319 B2
(45) Date of Patent: Dec. 3, 2019

(54) DEVICE INCLUDING MULTI-MODE INPUT PAD (71) Applicant: SKYWORKS SOLUTIONS, INC., Woburn, MA (US)

(72) Inventors: Bo Zhou, Acton, MA (US); Guillaume Alexandre Blin, Carlisle, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 23 days.

(21) Appl. No.: 15/261,156

(22) Filed: Sep. 9, 2016

(65) Prior Publication Data
US 2017/0077916 A1  Mar. 16, 2017

Related U.S. Application Data

(60) Provisional application No. 62/217,567, filed on Sep. 11, 2015.

(51) Int. Cl.
| | |
|---|---|
| *H03K 5/153* | (2006.01) |
| *H03K 5/24* | (2006.01) |
| *G06F 13/00* | (2006.01) |
| *H03K 19/0175* | (2006.01) |
| *H04B 1/38* | (2015.01) |

(52) U.S. Cl.
CPC ............... *H03K 5/24* (2013.01); *G06F 13/00* (2013.01); *H03K 19/0175* (2013.01); *H04B 1/38* (2013.01)

(58) Field of Classification Search
None
See application file for complete search history.

(56) References Cited

U.S. PATENT DOCUMENTS

| | | | |
|---|---|---|---|
| 8,627,127 B2* | 1/2014 | Mucignat | G05D 23/1905 713/320 |
| 2009/0182920 A1 | 7/2009 | Chao | |
| 2014/0281076 A1* | 9/2014 | Breece, III | G06F 13/42 710/106 |
| 2017/0322730 A1* | 11/2017 | Gillingham | G06F 13/1694 |

FOREIGN PATENT DOCUMENTS

CN           101482749 A       7/2009

* cited by examiner

*Primary Examiner* — Lincoln D Donovan
*Assistant Examiner* — Khareem E Almo
(74) *Attorney, Agent, or Firm* — Lando & Anastasi, LLP (57) ABSTRACT

A circuit component has a network address. The network address is determined from a voltage level applied to a single electrical contact of the circuit component. The circuit component is configured to select from among at least three unique network addresses based on the voltage level.

19 Claims, 8 Drawing Sheets

DEVICE INCLUDING MULTI-MODE INPUT PAD

CROSS-REFERENCE TO RELATED APPLICATION

This application claims priority under 35 U.S.C. § 119(e) to U.S. Provisional Application Ser. No. 62/217,567 titled "MULTI-MODE INPUT PAD," filed Sep. 11, 2015, which is incorporated herein by reference in its entirety for all purposes.

BACKGROUND

1. Field of Invention

Aspects and embodiments of the present invention relate generally to communications circuitry and methods for providing communication between different components or circuits of an electronic device.

2. Discussion of Related Art

In many electronic devices, a master component or master circuit may communicate with a plurality of secondary or slave components or circuits. The different secondary or slave components are typically provided with addresses that the master component may use to specify a particular secondary component to which data from the master component is to be directed and to identify a particular secondary component from which data is to be received by the master component. The different secondary or slave components may be hard wired to include a representation of an address in their circuitry or may be programmed to include a representation of the address in, for example, electrically erasable programmable read-only memory components of the different secondary or slave components. When multiple identical secondary or slave components are provided in a single device, multiple pins or pads of the secondary or slave components may be needed on each of the secondary components to specify the address.

SUMMARY OF INVENTION

In accordance with an aspect disclosed herein, there is provided a circuit component having an address, the address determined from a voltage level applied to a single external electrical contact of the circuit component. The circuit component is configured to be assigned one of at least three unique addresses and to select from among the at least three unique addresses based on the voltage level.

In some embodiments, the address assumes a first value responsive to the voltage level being a first voltage level, a second value responsive to the voltage level being a second voltage level, and a third value responsive to the voltage level being a floating voltage level between the first voltage level and the second voltage level, termed a floating voltage level herein. The floating voltage level may be determined by a voltage divider circuit connected between a first terminal configured to receive the first voltage level and a second terminal configured to receive the second voltage level. The voltage divider circuit may be internal to the circuit component. The voltage divider circuit may be external to the circuit component. The first voltage level may correspond to a supply voltage of the circuit component and the second voltage level may correspond to a ground reference voltage of the circuit component.

In some embodiments, the circuit component is configured to be connected to a clock signal line and a data signal line in an electronic device along with at least two other substantially identical circuit components also configured to be connected to the clock signal line and the data signal line, each of the circuit component and the at least two other substantially identical circuit components having a unique address selected from among the at least three unique addresses. The electronic device may further comprise a master circuit component also connected to the clock signal line and the data signal line in the electronic device.

In some embodiments, the circuit component further comprises electronic circuitry configured to determine the address from the voltage level applied to the single electrical contact. The electronic circuitry includes a voltage divider and a plurality of comparators. The single electrical contact may be in electrical contact with an input of each of the plurality of comparators.

In some embodiments, the circuit component is included in an RF electronic device module. In some embodiments, the circuit module is included in an RF device.

In accordance with another aspect, there is provided an electronic device. The electronic device comprises a master circuit component and a plurality of secondary or slave circuit components. Each of the plurality of secondary or slave circuit components is configured to be assigned a unique address selected from among at least three unique addresses by application of a voltage to a single electrical contact of each respective one of the plurality of secondary circuit components. Different levels of the voltage applied to the single electrical contact are associated with different unique addresses. The master circuit is configured to define a particular one of the plurality of secondary or slave circuit components to communicate with by transmitting one of the unique addresses over a data signal line electrically coupled to a communication interface in each of the plurality of secondary or slave circuit components.

In some embodiments, each of the secondary or slave circuit components is configured to select from among the at least three unique addresses to assign to itself. Each of the secondary or slave circuit components may be configured to assign itself one of the at least three unique addresses responsive to the single electrical contact not being coupled to one of a supply voltage of the electronic device and ground.

In some embodiments, the master circuit component and the plurality of secondary or slave circuit components communicate via a serial bus protocol including a clock signal line and a single data line.

In some embodiments, each of plurality of secondary or slave circuit components is assigned one unique address of the at least three unique addresses responsive to a level of the voltage applied to the single electrical contact of each respective one of the plurality of secondary or slave circuit components being between one pair of a plurality of pairs of voltage thresholds. The plurality of pairs of voltage thresholds may be defined by voltage divider circuits internal to each respective one of the plurality of secondary or slave circuit components.

In some embodiments, each of plurality of secondary or slave circuit components is identical in design.

In some embodiments, the electronic device is included in an RF device.

In accordance with another aspect, there is provided a method of operating an electronic device. The method comprises assigning unique addresses to each respective one of a plurality of circuit components of the electronic device by applying different voltages to a single electrical contact of each respective one of the plurality of circuit components. Each of the plurality of circuit components is configured assign itself an address selected from among at least three unique addresses based upon a voltage level applied to the single electrical contact.

In some embodiments, the method further comprises defining an individual one of the plurality of circuit components with which a master circuit component is to communicate by sending the unique address of the individual one of the plurality of circuit components to each of the plurality of circuit components over a serial data line.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation, and are not intended as a definition of the limits of the invention. In the drawings.

DETAILED DESCRIPTION

Aspects and embodiments disclosed herein facilitate communications between a master component or circuit in an electronic device and multiple secondary or slave components or circuits in the electronic device. Aspects and embodiments disclosed herein include circuits and methods for defining unique addresses for multiple secondary or slave components or circuits in an electronic device that are less complex and less expensive than prior known methods. In particular, various aspects and embodiments disclosed herein utilize a single electrical contact or pad in secondary circuits in an electronic device to define unique addresses for each of the secondary circuits in the electronic device.

Figure 1:
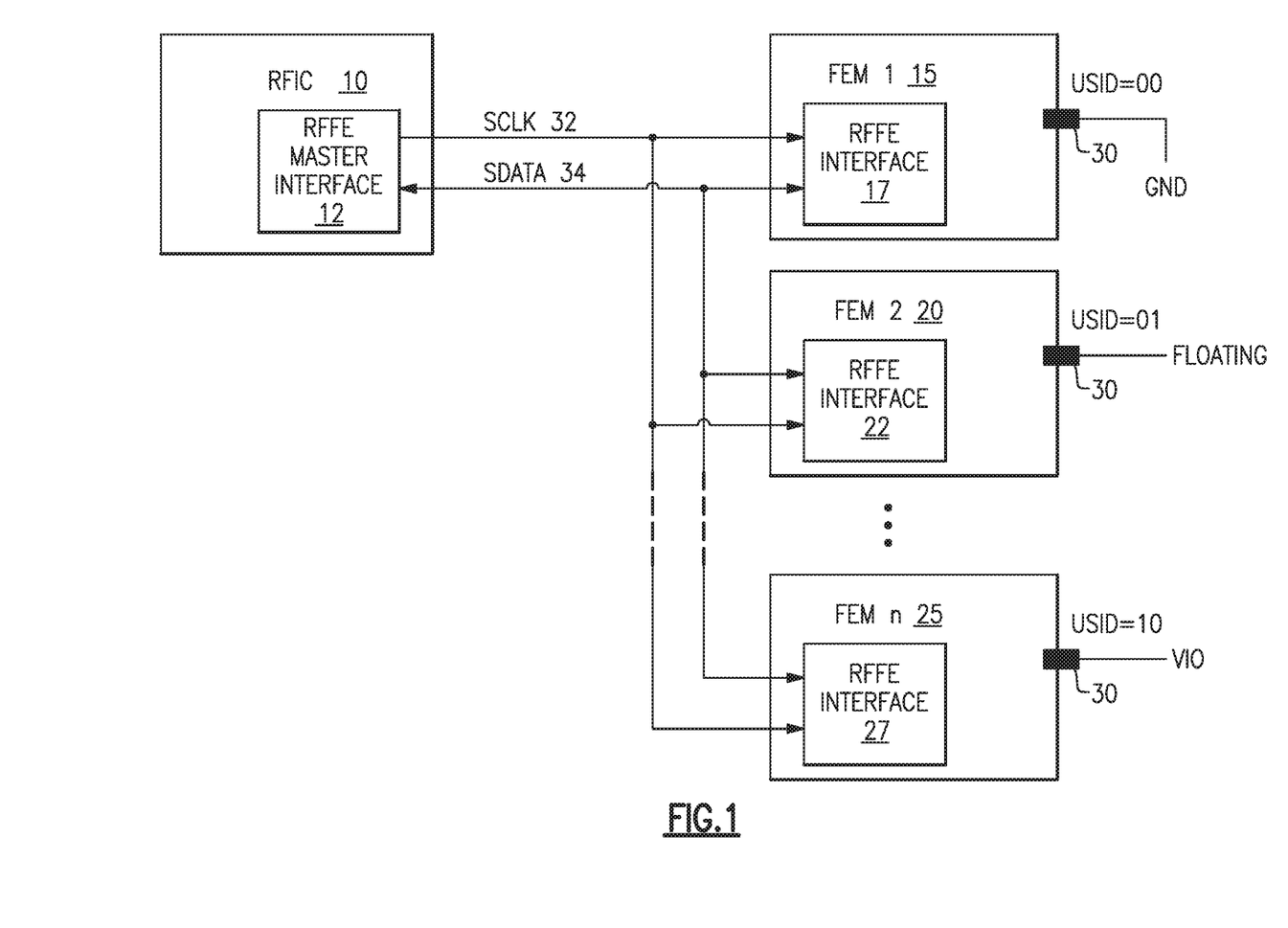
FIG. 1 is a schematic diagram of an embodiment of an arrangement of circuit components of an electronic device.

FIG. 1 illustrates a number of circuit components of an electronic device or an electronic device module. The electronic device may be, for example, a mobile telephone or other radio frequency device. It should be appreciated that the disclosed circuit components may be included in the electronic device along with multiple other circuit components or modules not described herein. In some embodiments, the different circuit components are included in different integrated circuit packages, however, in other embodiments, the different circuit components may be commonly packaged and/or may be different sub-components of a larger circuit or system, for example, different sub-circuits of an individual integrated circuit.

In some embodiments, the circuit components disclosed in FIG. 1 may be radio frequency (RF) circuit components. The RF circuit components of FIG. 1 include a master RFIC (radio frequency integrated circuit) 10 and a plurality of secondary circuit components 15, 20, 25, labeled as FEM 1 (front end module 1), FEM 2, and FEM n, respectively. The master RFIC 10 is referred to herein as a multi-mode RFIC. In some embodiments, the secondary circuit components include one or more of a power amplifier, low noise amplifier, transmission and/or reception module, a switch, or a cellular interface. It should be appreciated that although only three secondary circuit components are illustrated in FIG. 1, the electronic device may include more than three, for example, 16, 32, 64, 256, or more secondary circuit components in communication with one or more master RFICs.

In some embodiments, the circuit components illustrated in FIG. 1 communicate utilizing a communication protocol as defined by the MIPI® Alliance Specification for RF Front-End Control Interface (RFFE$^{SM}$), Version 2.0. This communication protocol utilizes a serial bus protocol including a clock signal line, indicated as SCLK 32 in FIG. 1, and a single data line, indicated as SDATA 34 in FIG. 1, although other serial bus protocols could be used. The SCLK and SDATA lines 32, 34 are shared among all of the disclosed secondary circuit components and are used to carry communications between each of the secondary circuit components and the master RFIC 10. The SCLK and SDATA lines 32, 34 couple a RFFE master interface 12 in the master RFIC 10 to RFFE interfaces 17, 22, 27 in each of the secondary circuit modules 15, 20, and 25, respectively. The master RFIC 10 identifies a particular secondary circuit component to which a data signal from the master circuit RFIC 10 is intended by embedding an address (e.g., a bus address) of the desired secondary circuit component along with a data package in a signal sent along the SDATA line 34. The addresses of the secondary circuit components are indicated in FIG. 1 as USID (user identification) numbers. FEM 1 15 is illustrated as having a USID of 00, FEM 2 20 as having a USID of 01, and FEM n 25 as having a USID of 10.

It should be appreciated, however, that aspects and embodiments disclosed herein are not limited to use of the RFFE communication protocol. In various embodiments, the communications interface may be, for example, a 1-wire interface, a 2-wire interface, or a 3-wire interface, and the communications protocol may include, for example, I2C, 3 or 4-wire SPI, various MIPI buses, digRF, Maxim™ 1-Wire®, etc.

Figure 2:
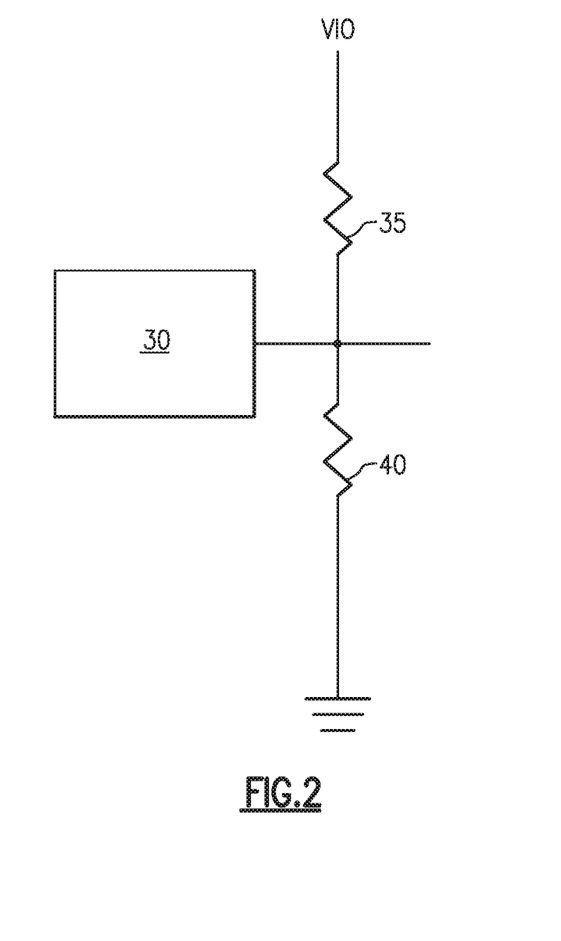
FIG. 2 is a schematic diagram of an embodiment of a voltage divider included in one or more of the circuit components of FIG. 1.

The USIDs of the secondary circuit components are defined by voltages applied to the USID pads 30 in each of the secondary devices. As illustrated in FIG. 1 the USID pad 30 of FEM 1 15 is coupled to a first voltage level, for example, ground (GND) to define the USID of FEM 1 15 as 00. The USID pad 30 of FEM n 25 is coupled to a second voltage level, for example, a supply voltage (VIO) of the electronic device to define the USID of FEM n 25 as 10. The USID pad 30 of FEM 2 20 is left floating to define the USID of FEM 2 20 as 01. In some embodiments, the USID pad 30 of FEM 2 20 is electrically coupled to a point between a pair of resistors 35 and 40 connected between VIO and GND (or other first and second voltage levels) as illustrated in FIG. 2 such that the voltage applied to the USID pad 30 of FEM 2 20 is defined between VIO and GND (or between the other first and second voltage levels) at a level defined by the resistance values of resistors 35 and 40. In some embodiments, when left floating, additional or alternate internal circuitry of a secondary device may set the voltage of the USID pad 30 of the secondary device at a defined level between VIO and GND. Resistors 35 and 40 are, in some embodiments, internal components of a secondary circuit component. In other embodiments, resistors 35 and/or 40 may be external to the secondary circuit component.

The coupling of the USID pads 30 of the secondary circuit components to VIO, GND, or another voltage level to define the USID of each secondary circuit component is performed outside of the secondary circuit components themselves. Accordingly, each of the secondary circuit components, or at least a sub-set of the secondary circuit components, may be identical circuit components that are provided with individual addresses when installed into an electronic device or a module for an electronic device.

Figure 3:
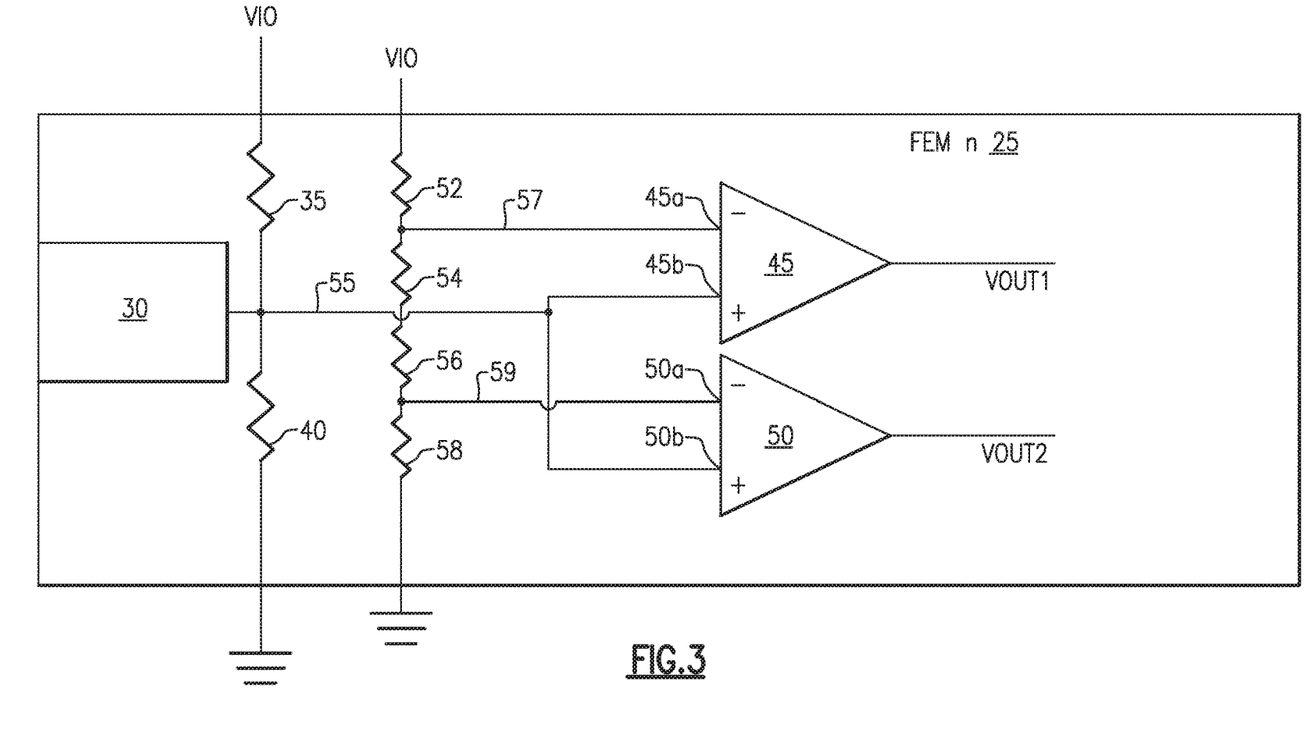
FIG. 3 is a schematic diagram of one of the circuit components of FIG. 1.

The secondary circuit components desirably include internal circuitry that may be used by the secondary circuit components to identify their assigned addresses and thus "know" what data from the master RFIC 10 is intended for which secondary circuit component. An embodiment of this internal circuitry of a secondary circuit component (indicated as FEM n 25) is illustrated in FIG. 3. The external USID pad voltage setting circuitry is not illustrated in FIG. 3 for clarity.

In FIG. 3, an electrical connection is made between the USID pad 30 to non-inverting inputs 45b, 50b of a pair of comparators 45 and 50, respectively, through a signal line 55. A voltage divider circuit including resistors 52, 54, 56, and 58 is provided between a terminal connected to a first voltage, for example, VIO and another terminal connected to a second voltage, for example, ground. Electrical connection to the voltage divider is made by a signal line 57 from a point between resistors 52 and 54 to the inverting input 45a of comparator 45. Electrical connection is also made by a signal line 59 from a point between resistors 56 and 58 to the inverting input 50a of comparator 50. Thus, if the voltage of the USID pad 30 is less than that at the point between resistors 52 and 54, the output VOUT1 of comparator 45 will be a logical 0. Similarly, if the voltage of the USID pad 30 is less than that at the point between resistors 56 and 58, the output VOUT2 of comparator 50 will be a logical 0. If the voltage of the USID pad 30 is greater than that at the point between resistors 52 and 54, the output VOUT1 of comparator 45 will be a logical 1. Similarly, if the voltage of the USID pad 30 is greater than that at the point between resistors 56 and 58, the output VOUT2 of comparator 50 will be a logical 1. The combination of the states of VOUT1 and VOUT2 is used to define an address for each of the component 15, 20, 25. Each component 15, 20, 25 includes circuitry to read the states of VOUT1 and VOUT2 and thus determine the address assigned to it. A logic table for the circuitry of FIG. 3 is as indicated in Table 1 below. In this table the "floating" voltage level is assumed to be between the voltage at the point between resistors 52 and 54 and the voltage at the point between resistors 56 and 58 and is set by the voltage divider circuit including resistors 35 and 40 included in FEM n 25.

TABLE 1

| USID Pad Voltage | VOUT 1 | VOUT2 | FEM n Address |
|---|---|---|---|
| GND | 0 | 0 | 00 |
| Floating | 0 | 1 | 01 |
| VIO | 1 | 1 | 10 |

In one embodiment, each of resistors 52, 54, 56, and 58 has an equal resistance value, the voltage at the point between resistors 52 and 54 is 0.75 VIO, and the voltage at the point between resistors 56 and 58 is 0.25 VIO. FEM n 25 will thus be assigned an address of 00 for any USID pad voltage below 0.25 VIO, an address of 10 for any USID pad voltage above 0.75 VIO, and an address of 01 for any USID pad voltage between 0.25 VIO and 0.75 VIO.

It should be understood that resistors 52, 54, 56, and 58 need not have equal resistances. If the resistors 52, 54, 56, and 58 had different resistances, the voltage set points for determining the levels of VOUT1 and VOUT2 and the address of FEM n 25 would change from those described above as would be appreciated by one of ordinary skill in the art. Similarly, it should be appreciated that the first and second voltage levels may differ from VIO and ground and can be any two voltage levels, for example, positive and negative device component supply voltages, or any other voltages in between. From Table 1, it can be seen that the circuit of FIG. 3 may be useful for assigning one of three unique addresses to a secondary circuit component using only a single USID pad 30. In other embodiments, however, it may be desirable to assign unique addresses to more than three different secondary circuit components in an electronic device that are coupled to a same signal line. To assign unique addresses to more than three different secondary circuit components in an electronic device, the circuitry of FIG. 3 may be expanded upon as illustrated in the embodiment of FIG. 4.

Figure 4:
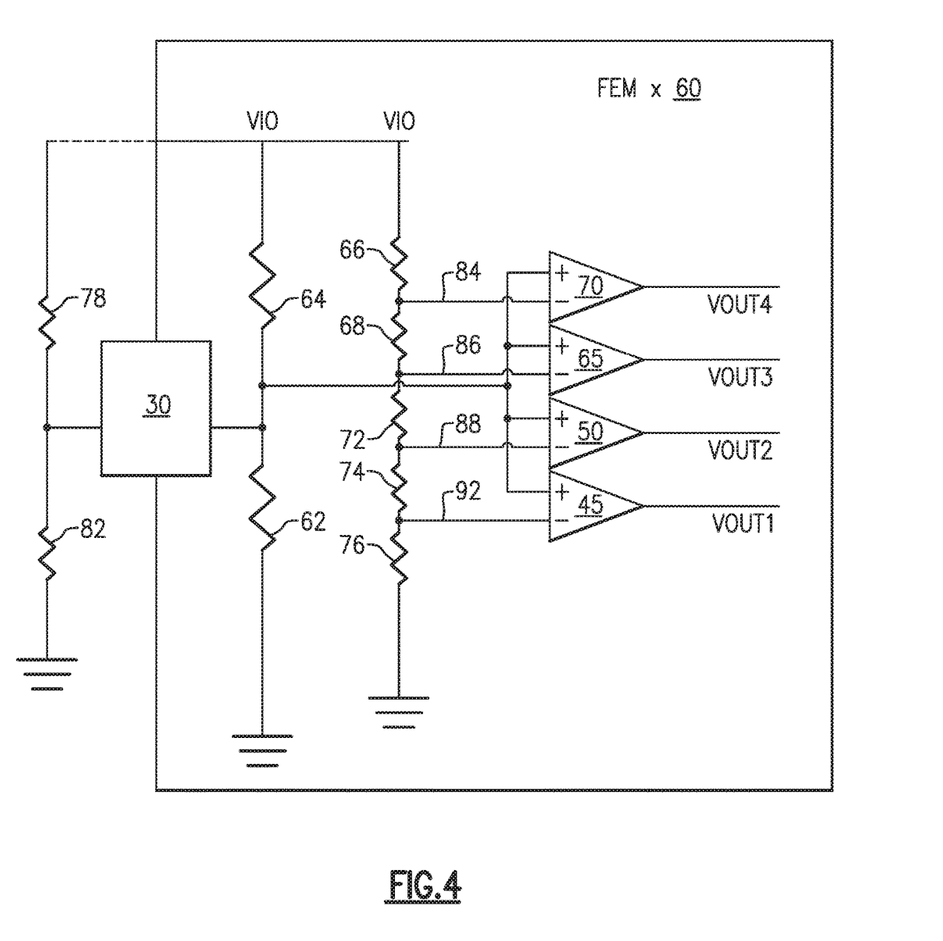
FIG. 4 is a schematic diagram of another embodiment of one of the circuit components of FIG. 1.

In FIG. 4, the secondary circuit module is designated as FEM x 60. FEM x 60 includes a USID pad 30 and a voltage divider circuit including resistors 62 and 64 that set a floating point voltage for the USID pad 30 if no external voltage setting circuitry, for example, resistors 78 or 82 are utilized. Resistor 62 has a first terminal electrically connected to a first voltage, for example, ground and a second terminal electrically connected to the USID pad 30. Resistor 64 has a first terminal connected to a second voltage, for example, VIO and a second terminal connected to the USID pad 30. An electrical connection is made between the USID pad 30 and the non-inverting inputs of comparators 45, 50, 65, and 70. A voltage divider circuit including resistors 66, 68, 72, 74, and 76 is provided between a terminal connected to VIO and another terminal connected to ground. Electrical connection is made by a signal line 84 from a point between resistors 66 and 68 to the inverting input of comparator 70. Electrical connection is made by a signal line 86 from a point between resistors 68 and 72 to the inverting input of comparator 65. Electrical connection is made by a signal line 88 from a point between resistors 72 and 74 to the inverting input of comparator 50. Electrical connection is made by a signal line 92 from a point between resistors 74 and 76 to the inverting input of comparator 45.

If the voltage of the USID pad 30 is less than the voltage at the point between resistors 74 and 76, the output VOUT1 of comparator 45 will be a logical 0. If the voltage of the USID pad 30 is less than the voltage at the point between resistors 72 and 74, the output VOUT2 of comparator 50 will be a logical 0. If the voltage of the USID pad 30 is less than the voltage at the point between resistors 68 and 72, the output VOUT3 of comparator 65 will be a logical 0, and if the voltage of the USID pad 30 is less than the voltage at the point between resistors 66 and 68, the output VOUT4 of comparator 70 will be a logical 0.

If the voltage of the USID pad 30 is greater than the voltage at the point between resistors 74 and 76, the output VOUT1 of comparator 45 will be a logical 1. If the voltage of the USID pad 30 is greater than the voltage at the point between resistors 72 and 74, the output VOUT1 of comparator 50 will be a logical 1. If the voltage of the USID pad 30 is greater than the voltage at the point between resistors 68 and 72, the output VOUT3 of comparator 65 will be a logical 1, and if the voltage of the USID pad 30 is greater than the voltage at the point between resistors 66 and 68, the output VOUT4 of comparator 70 will be a logical 1.

The combination of the states of VOUT1, VOUT2, VOUT3, and VOUT4 is used to define an address for FEM x 60. FEM x 60 includes circuitry to read the states of VOUT1, VOUT2, VOUT3, and VOUT4 and thus determine the address assigned to it. A logic table for the circuitry of FIG. 4 is as indicated in Table 2 below.

TABLE 2

| USID Pad Voltage | VOUT 1 | VOUT 2 | VOUT 3 | VOUT 4 | USID |
|---|---|---|---|---|---|
| GND | 0 | 0 | 0 | 0 | 000 |
| External Pull-down | 1 | 0 | 0 | 0 | 001 |
| Floating | 1 | 1 | 0 | 0 | 010 |
| External Pull-up | 1 | 1 | 1 | 0 | 011 |
| VIO | 1 | 1 | 1 | 1 | 100 |

To achieve a USID pad voltage of GND in FEM x 60, the USID pad is tied to ground and the resistors 78 and 82 may be omitted. To achieve a USID pad voltage of "External Pull-Down," resistor 82 is present and resistor 78 is omitted. The "External Pull-down" voltage is determined by the relative resistances of resistors 62, 64, and 82. For example, if each of resistors 62, 64, and 82 had the same resistance values, the "External Pull-down" voltage would be VIO/3. To achieve a USID pad voltage of "Floating," resistors 78 and 82 are both omitted and the "Floating" voltage is determined by the relative resistance values of resistors 62 and 64. In some embodiments the "Floating" voltage level is between the "External Pull-down" voltage level and the "External Pull-up" voltage level. To achieve a USID pad voltage of "External Pull-up," resistor 78 is present and resistor 82 is omitted. The "External Pull-up" voltage is determined by the relative resistances of resistors 62, 64, and 78. For example, if each of resistors 62, 64, and 78 had the same resistance values, the "External Pull-up" voltage would be 2VIO/3. To achieve a USID pad voltage of VIO, the USID pad 30 may be tied to a terminal having a voltage of VIO, and both resistors 78 and 82 may be omitted.

To achieve the logical outcomes illustrated in Table 2, resistors 66, 68, 72, 74, and 76 are selected with resistances such that the voltage at the point between resistors 74 and 76 is less than the "External Pull-down" voltage (between GND and the "External Pull-down" voltage), the voltage at the point between resistors 74 and 72 is between the "External Pull-down" voltage and the "Floating" voltage, the voltage at the point between resistors 72 and 68 is between the "Floating" voltage and the "External Pull-up" voltage, and the voltage at the point between resistors 68 and 66 is between the "External Pull-up" voltage and VIO. The values of the voltages between the different pairs of resistors 66, 68, 72, 74, and 76 may be considered threshold voltages for achieving particular USIDs for FEM x 60. In one particular example, the resistances of 66, 68, 72, 74, and 76 are selected with resistances as indicated in Table 3 below, where "R" is an arbitrary resistance value constant, to set voltages between the different pairs of resistors 66, 68, 72, 74, and 76 to the levels indicated.

TABLE 3

| | Resistance of Resistor | | | | |
|---|---|---|---|---|---|
| | 66 = R | 68 = 2R | 72 = 2R | 74 = 2R | 76 = R |
| Resistors between which voltage is observed | | 76 and 74 | 74 and 72 | 72 and 68 | 68 and 66 |
| Voltage | | 0.125 VIO | 0.375 VIO | 0.625 VIO | 0.875 VIO |

With the threshold voltages of Table 3, USID pad voltages that would achieve the outputs illustrated in Table 2 could be selected based upon an appropriate selection of relative resistance values for resistors 62, 64, 78, and 82 to be, for example,
GND=0 VIO
External Pull-down=0.25 VIO
Floating=0.5 VIO
External Pull-up=0.75 VIO
VIO=VIO It should be appreciated that the resistance values and voltage levels indicated above are only examples and other resistance values, USID pad voltage levels, and/or threshold voltage levels may be utilized as desired. For example, in one embodiment, each of resistors 66, 68, 72, 74, and 76 have identical resistance values. Similarly, it should be appreciated that the first and second voltage levels may differ from VIO and ground and can be any two voltage levels, for example, positive and negative device component supply voltages, or any other voltages in between.

The circuit illustrated in FIG. 4 may be useful in instances where it is desired to provide up to five different unique addresses for secondary circuit components in a device. Those five different addresses may be provided using only a single USID pad 30 on each of the secondary circuit components in the device, thus minimizing the number of external pads or pins of the circuit or module in which the interface is integrated. It should be appreciated that the circuit designs of FIG. 3 and FIG. 4 are scalable to provide an arbitrary number of unique addresses for secondary circuit components in a device. For example, voltage divider resistors in addition to resistors 66, 68, 72, 74, and 76 illustrated in FIG. 4 and comparators in addition to comparators 45, 50, 65, and 70 illustrated in FIG. 4 may be added to the circuit of FIG. 4 to provide for additional available addresses.

Although illustrated in FIG. 3 and FIG. 4 as comparators, it should be appreciated that additional or alternate circuit elements may be included in the circuit components of FIG. 3 or FIG. 4 to provide an indication of the voltage level applied to the USID pads 30 and to determine an address for the circuit component based on the measured USID pad voltage. Such devices may include, for example, analog-to-digital converters, a current monitor that measures a current from the USID pads 30 across a known resistive load to ground, or any other circuit element known in the art for determining an address for a circuit component based on a voltage applied to a USID pad 30.

As discussed above, aspects and embodiments may realize a system and method for providing communications between electronic circuit components that is simpler and less expensive than previously known systems and methods. It will be appreciated by those skilled in the art, given the benefit of this disclosure, that configuring components or devices as disclosed herein enables the use of a single part for numerous components or devices in an electronic module connected on the same board and individually addressable using the same serial interface. Aspects and embodiments disclosed herein may be applied to a module that contains a semiconductor on which the interface can be built and any number of other active devices (PA, LNA, ADC, DAC, power management, memory, microprocessor, etc.) and any number of passive devices (resistors, capacitors, filters, duplexers, MEMS, etc.)

Figure 5A:
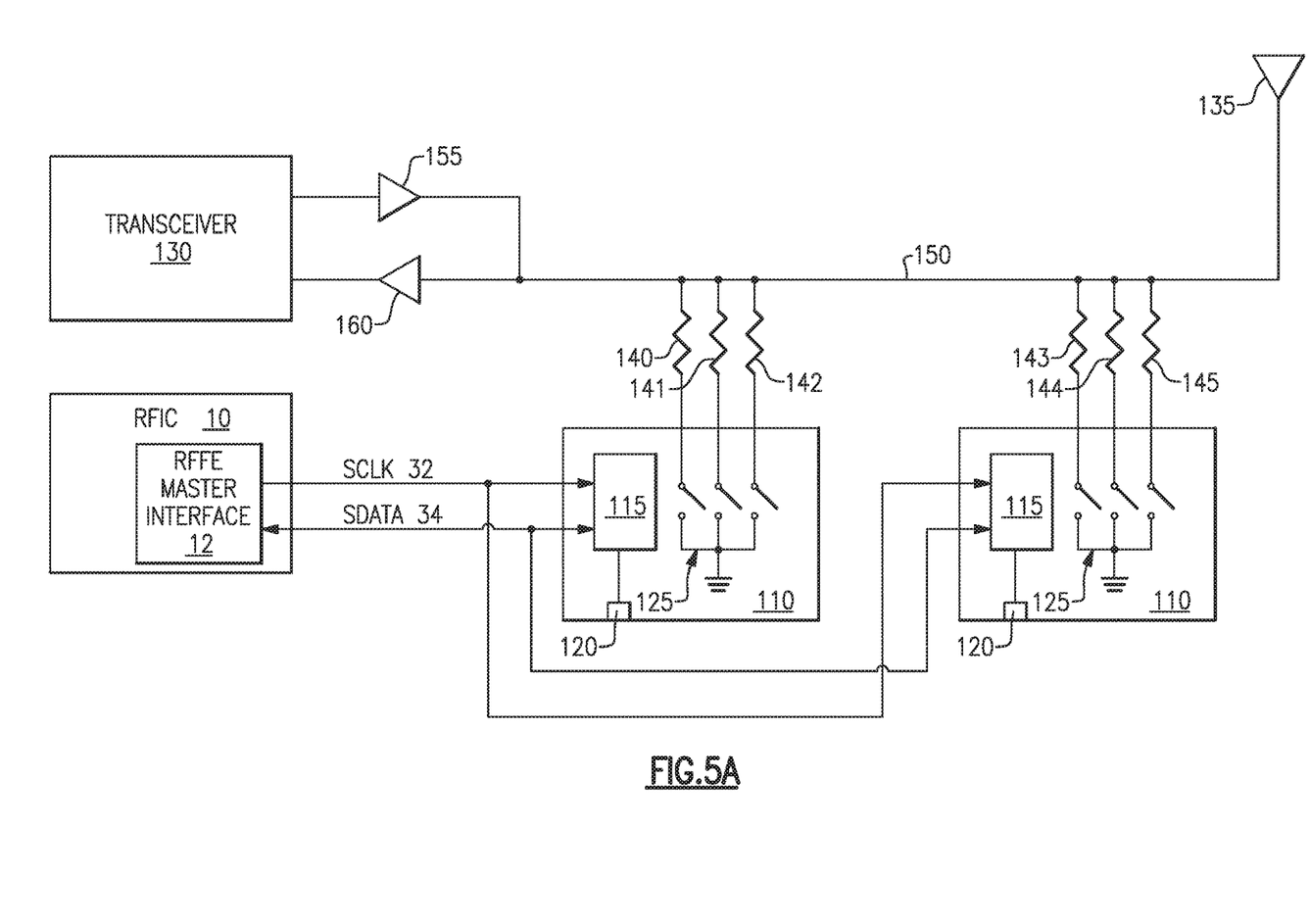
FIG. 5A is a schematic diagram of an embodiment of a circuit including a multi-mode RFIC utilized for controlling impedance of a signal line in an RF device.

In an example implementation, a single master device, for example, a multi-mode RFIC 10 as illustrated in FIG. 1 may be utilized to control the impedance of a signal line in an RF device, for example, to provide impedance matching between the output of a power amplifier and an antenna and/or between the input of a low noise amplifier and an antenna. As illustrated in FIG. 5A, a transceiver 130 is in electrical communication with an antenna 135 via a signal line 150. Transmission signals generated in the transceiver 130 pass from the transceiver 130 through power amplifier 155 and signal line 150 to antenna 135. Signals received at antenna 135 pass from antenna 135 through signal line 150 and low noise amplifier 160 to transceiver 130. Any one or more of the antenna 135, power amplifier 155, or low noise amplifier 160 may exhibit different input or output impedances at different frequencies. It may thus be desirable to adjust the impedance of the signal line 150 to provide impedance matching between the antenna 135, power amplifier 155, and/or low noise amplifier 160 depending on the frequency or frequencies of transmission signals generated by the transceiver 120 or the frequency or frequencies of signals desired to be received from the antenna 135.

Master RFIC 10 is in electrical communication with a plurality of switch components 110, each of which may be identical to one another. Data communicated to the RFFE secondary interface/logic circuitry 115 from the Master RFIC 10 via data line SDATA 34 includes addresses corresponding to addresses set by different voltages applied to the USID pads 120 of each of the different switch components 110. An address communicated via data line SDATA 34 from the Master RFIC 10 determines which of the switch components 110 is the intended recipient of further data sent from the Master RFIC 10 via data line SDATA 34 and/or which of the switch components 110 the Master RFIC 10 is requesting data from for a particular time period. In one specific non-limiting example, the switch components 110 may be or may include the SKY19237-001 shunt switch available from Skyworks Solutions, Inc.

Responsive to receipt of instructions from the Master RFIC 10 each of the switch components 110 may open or close one or more control switches 125. The control switches 125 control which one or more (or none) of resistors 140, 141, 142, 143, 144, 145 are electrically coupled to ground, and thus, the impedance of the signal line 150. It should be appreciated that in some embodiments, additional switch components 110 and resistors than illustrated may be provided to provide for a greater degree of adjustability of the impedance of the signal line 150.

Figure 5B:
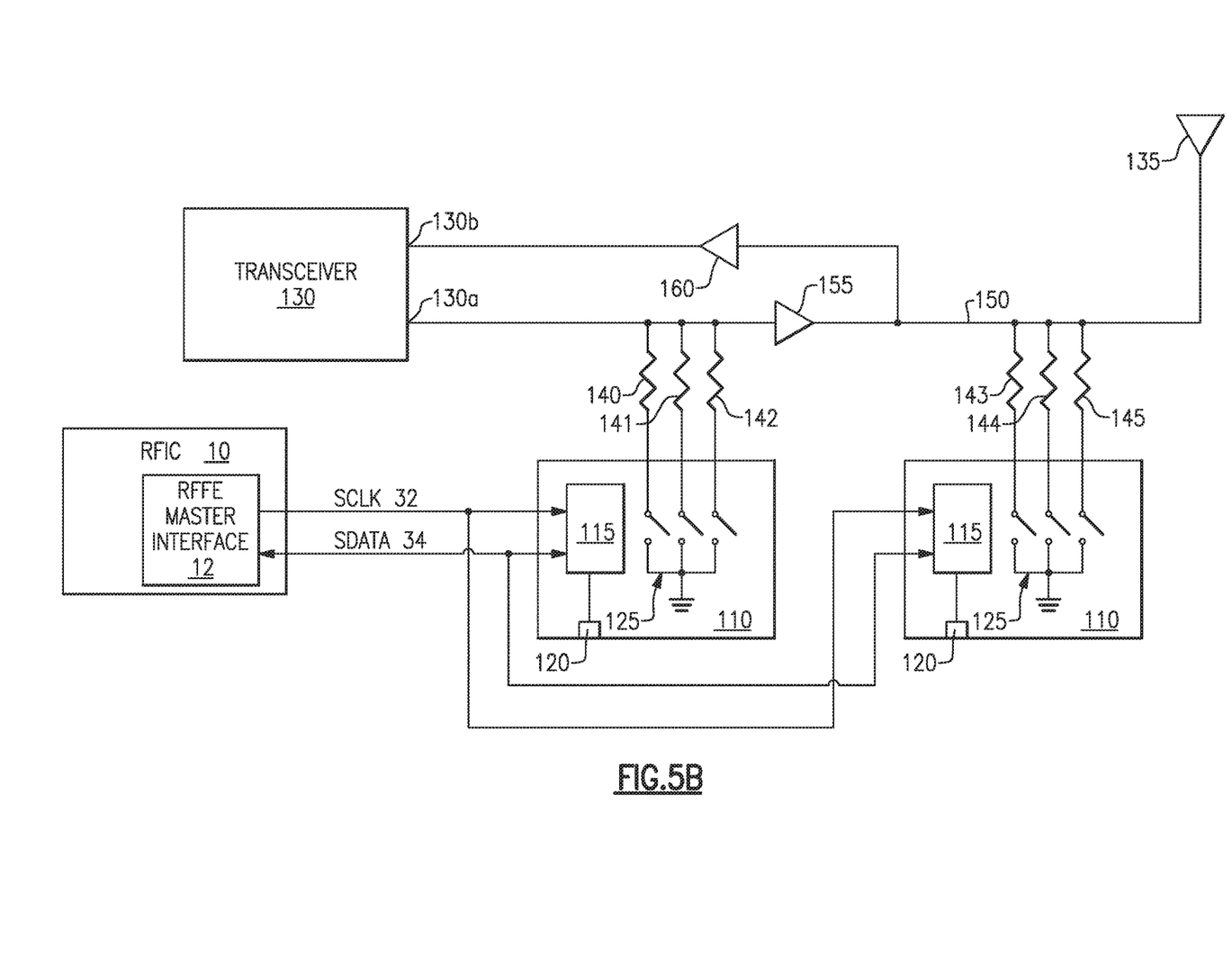
FIG. 5B is a schematic diagram of another embodiment of a circuit including a multi-mode RFIC utilized for controlling impedance of a signal line in an RF device.

In another embodiment, illustrated in FIG. 5B, the power amplifier 155 and low noise amplifier 160 may be coupled to the signal line 150 between groups of resistors. In such an embodiment, resistors 140, 141, and 142 may control the impedance of the signal line 150 between the transmission output 130A of the transceiver 130 and the input of the power amplifier 155 without altering the impedance of the signal line between the antenna 135 and the input of the low noise amplifier 160.

Figure 6:
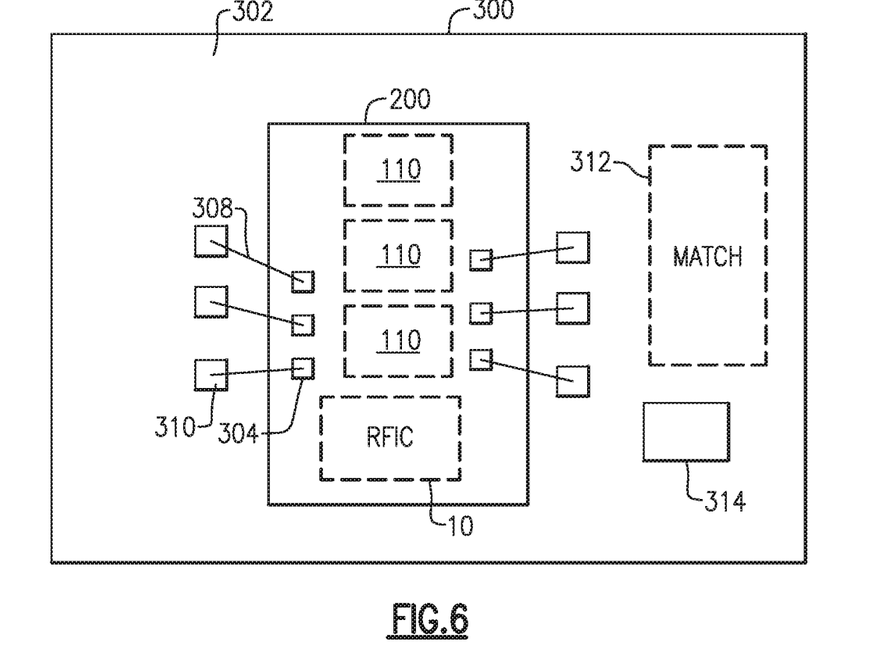
FIG. 6 is a block diagram of one example of an electronic device including a multi-mode RFIC.

Embodiments of the multi-mode RFIC 10 described herein, for example, the RFIC 10 illustrated in FIG. 1, can be implemented in a variety of different modules including, for example, a stand-alone master RFIC module, a front-end module, a module combining the multi-mode RFIC 10 with an antenna switching network, an impedance matching module, an antenna tuning module, or the like. FIG. 6 illustrates one example of a device 300 that can include any of the embodiments or examples of the multi-mode RFIC 10 discussed herein. The device 300 has a circuit board 302 that is configured to receive a plurality of components. In some embodiments, such components can include a multi-chip module 200 having one or more features as described herein. For example, the multi-chip module 200 can include a multi-mode RFIC 10 and a plurality of switch components 110 integrated therein. A plurality of connection pads 304 can facilitate electrical connections such as wirebonds 308 to connection pads 310 on the circuit board 302 to facilitate passing of various power supply voltages and data signals to and from the multi-chip module 200.

In some embodiments, other components can be mounted on or formed on the circuit board 302. For example, one or more passive devices 314, for example, capacitors, resistors, or inductors, and one or more impedance matching networks 312 can be implemented. In some embodiments, the circuit board 302 can include a laminate substrate. The plurality of switch components 110 may be assigned addresses as described with regard to FEM 1 15, FEM 2 20, and FEM n 25 of FIG. 1 and may selectively communicate with the multi-mode RFIC 10 based on addresses included in messages between the multi-mode RFIC 10 and the plurality of switch components 110.

In some embodiments, the device 300 or multi-chip module 200 can also include one or more packaging structures to, for example, provide protection and facilitate easier handling of the device 300. Such a packaging structure can include an overmold formed over the circuit board 302 and dimensioned to substantially encapsulate the various circuits and components thereon.

It will be understood that although the device 300 is described in the context of wirebond-based electrical connections, one or more features of the present disclosure can also be implemented in other packaging configurations, including flip-chip configurations.

Embodiments of the multi-mode RFIC 10 and associated addressable components disclosed herein, optionally packaged into the device 300, may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Figure 7:
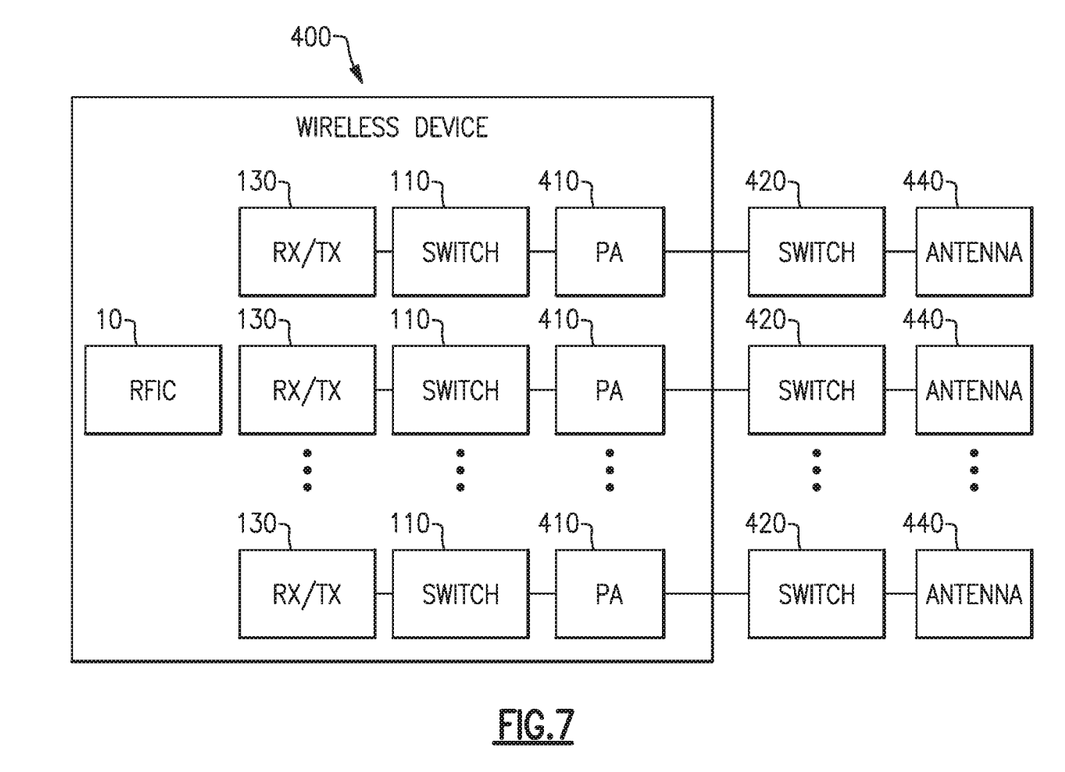
FIG. 7 is a block diagram of one example of a front end module including a multi-mode RFIC.

FIG. 7 is a block diagram of a front end module 400 including a multi-mode RFIC 10 according to certain embodiments. The front end module 400 can be included in a cellular phone, smart phone, tablet, modem, communication network or any other portable or non-portable device configured for voice and/or data communication. The front end module 400 includes a multi-mode RFIC 10 that can selectively communicate with selected ones of a plurality of switch components 110. The switch components 110 in turn control a plurality of transceivers 130 and/or facilitate impedance matching between transceivers 130 and power amplifiers 410. The transceiver 130 and associated power amplifiers 410 can be configured to receive and transmit signals from one or more of a plurality of antennas 440 in a known fashion. Antennas 440 may be disposed external to front end module 400 and may be electrically coupled to front end module 400 by switches 420. As will be appreciate by those skilled in the art, the power amplifiers 410 can be power amplifier components including one or more power amplifiers.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Directional terms such as "above," below," "left," "right," etc. are used herein as a matter of convenience for referencing various surfaces and orientations of features disclosed herein. There directional terms do not imply that the aspects and embodiments disclosed herein are necessarily oriented in any particular orientation.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

The teachings of the invention provided herein can be applied to other systems, not necessarily the system described above. The elements and acts of the various embodiments described above can be combined to provide further embodiments.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

What is claimed is:

1. A circuit component having an address, the address determined from only a single voltage level applied to a single external electrical contact of the circuit component, the single voltage level being one of a first voltage level, a second voltage level, and a predetermined voltage level between the first voltage level and second voltage level, the circuit component configured to be assigned one of at least three unique addresses and to select from among the at least three unique addresses based on only the single voltage level, the circuit component being configured to be connected to a clock signal line and a data signal line in an electronic device along with at least two other substantially identical circuit components also configured to be connected to the clock signal line and the data signal line, each of the circuit component and the at least two other substantially identical circuit components having a unique address selected from among the at least three unique addresses.

2. The circuit component of claim 1 wherein the address assumes a first value responsive to the single voltage level being the first voltage level, a second value responsive to the single voltage level being the second voltage level, and a third value responsive to the single voltage level being the predetermined voltage level between the first voltage level and the second voltage level.

3. The circuit component of claim 2 wherein the predetermined voltage level is determined by a voltage divider circuit connected between a first terminal configured to receive the first voltage level and a second terminal configured to receive the second voltage level.

4. The circuit component of claim 3 wherein the voltage divider circuit is internal to the circuit component.

5. The circuit component of claim 3 wherein the voltage divider circuit is external to the circuit component.

6. The circuit component of claim 3 wherein the first voltage level corresponds to a supply voltage of the circuit component and the second voltage level corresponds to a ground reference voltage of the circuit component.

7. The circuit component of claim 1 further comprising electronic circuitry configured to determine the address from the single voltage level applied to the single external electrical contact, the electronic circuitry including a voltage divider and a plurality of comparators, the single electrical contact in electrical contact with an input of each of the plurality of comparators.

8. The circuit component of claim 1 included in an RF electronic device module.

9. The circuit component of claim 8 included in an RF device.

10. An electronic device comprising:
a master circuit component; and
a plurality of secondary circuit components, each of the plurality of secondary circuit components configured to be assigned a unique address selected from among at least three unique addresses by application of only a single voltage to a single external electrical contact of each respective one of the plurality of secondary circuit components, the single voltage being one of a first voltage, a second voltage, and a predetermined voltage between the first voltage and second voltage, different levels of the single voltage applied to the single external electrical contact of each respective one of the plurality of secondary circuit components being associated with different unique addresses, the master circuit configured to define a particular one of the plurality of secondary circuit components to communicate with by transmitting one of the unique addresses over a signal line electrically coupled to a communication interface in each of the plurality of secondary circuit components, the master circuit component and the plurality of secondary circuit components being configured to communicate via a serial bus protocol including a clock signal line and a single data line.

11. The electronic device of claim 10 wherein each of the secondary circuit components is configured to select from among the at least three unique addresses to assign to itself.

12. The electronic device of claim 11 wherein each of the secondary circuit components is configured to assign itself one of the at least three unique addresses responsive to the single external electrical contact not being coupled to one of a supply voltage of the electronic device and ground.

13. The electronic device of claim 10 wherein each of plurality of secondary circuit components is assigned one unique address of the at least three unique addresses responsive to a level of the single voltage applied to the single external electrical contact of each respective one of the plurality of secondary circuit components being between one pair of a plurality of pairs of voltage thresholds.

14. The electronic device of claim 13 wherein the plurality of pairs of voltage thresholds are defined by voltage divider circuits internal to each respective one of the plurality of secondary circuit components.

15. The electronic device of claim 10 wherein each of plurality of secondary circuit components is identical in design.

16. The electronic device of claim 10 included in an RF device.

17. A method of operating an electronic device, the method comprising assigning unique addresses to each respective one of a plurality of circuit components of the electronic device by applying different single voltages to a single external electrical contact of each respective one of the plurality of circuit components, the single voltage being one of a first voltage, a second voltage, and a predetermined voltage between the first voltage and second voltage, each of the plurality of circuit components being configured to assign itself an address selected from among at least three unique addresses based upon only the single voltage applied to each of the respective single external electrical contacts, each of the plurality of circuit components communicating with a master circuit component of the electronic device via a serial bus protocol including a clock signal line and a data signal line.

18. The method of claim 17 further comprising defining an individual one of the plurality of circuit components with which a master circuit component is to communicate by sending the unique address of the individual one of the plurality of circuit components to each of the plurality of circuit components over a serial data line.

19. A circuit component having an address, the address determined from only a single voltage level applied to a single external electrical contact of the circuit component, the single voltage level being one of a first voltage level, a second voltage level, and a predetermined voltage level between the first voltage level and second voltage level, the circuit component configured to be assigned one of at least three unique addresses and to select from among the at least three unique addresses based on only the single voltage level, the circuit component including electronic circuitry configured to determine the address from the single voltage level applied to the single external electrical contact, the electronic circuitry including a voltage divider and a plurality of comparators, the single electrical contact in electrical contact with an input of each of the plurality of comparators.

* * * * *